(12) United States Patent
Jakubowski et al.

(10) Patent No.: US 8,415,214 B2
(45) Date of Patent: Apr. 9, 2013

(54) STI SILICON NITRIDE CAP FOR FLAT FEOL TOPOLOGY

(75) Inventors: Frank Jakubowski, Dresden (DE); Peter Baars, Dresden (DE); Jörg S. Radecker, Dresden (DE)

(73) Assignee: Globalfoundries, Inc., Grand Cayman (KY)

( * ) Notice: Subject to any disclaimer, the term of this patent is extended or adjusted under 35 U.S.C. 154(b) by 57 days.

(21) Appl. No.: 13/010,110

(22) Filed: Jan. 20, 2011

(65) Prior Publication Data

US 2012/0187450 A1      Jul. 26, 2012

(51) Int. Cl.
*H01L 21/76* (2006.01)

(52) U.S. Cl.
USPC ............ 438/207; 438/221; 438/248; 257/192

(58) Field of Classification Search .................. 438/207, 438/221, 248; 257/192
See application file for complete search history.

(56) References Cited

U.S. PATENT DOCUMENTS

| 5,728,621 A * | 3/1998 | Zheng et al. .................. 438/427 |
| 6,048,775 A * | 4/2000 | Yao et al. ...................... 438/427 |
| 2005/0048703 A1* | 3/2005 | Dennard et al. .............. 438/149 |

* cited by examiner

*Primary Examiner* — Kimberly Rizkallah
*Assistant Examiner* — Timor Karimy
(74) *Attorney, Agent, or Firm* — Ditthavong Mori & Steiner, P.C.

(57) ABSTRACT

Transistor devices are formed with a nitride cap over STI regions during FEOL processing. Embodiments include forming a pad oxide layer on a substrate, forming an STI region in the substrate so that the top surface is level with the top surface of the pad oxide, forming a nitride cap on the STI region and on a portion of the pad oxide layer on each side of the STI region, implanting a dopant into the substrate, deglazing the nitride cap and pad oxide layer, removing the nitride cap, and removing the pad oxide layer. Embodiments include forming a silicon germanium channel (c-SiGe) in the substrate prior to deglazing the pad oxide layer. The nitride cap protects the STI regions and immediately adjacent area during processes that tend to degrade the STI oxide, thereby providing a substantially divot free substrate and an STI region with a zero step height for the subsequently deposited high-k dielectric and metal electrode.

15 Claims, 4 Drawing Sheets

STI SILICON NITRIDE CAP FOR FLAT FEOL TOPOLOGY

TECHNICAL FIELD

The present disclosure relates to the fabrication of semiconductor devices using a shallow trench isolation (STI) nitride cap during front end of line (FEOL) processing. The present disclosure is particularly applicable to semiconductor devices in 32 nanometer (nm) technology nodes and beyond.

BACKGROUND

In silicon on insulator (SOI) and bulk technologies, for example 32 nm SOI or 28 nm bulk technologies, the FEOL topology, particularly the STI height, is critical for encapsulation of a high-k/titanium nitride (TiN) gate stack, especially for gate first integration. However, STI step height is difficult to control through various FEOL processes after formation of the STI region. As illustrated in FIGS. 1A through 1C, STI regions are conventionally formed by forming a pad oxide layer 101 to a thickness of 3 nm to 10 nm on an upper surface of a substrate, for example SOI substrate 103 (formed of a substrate 105, buried oxide layer 107, and silicon layer 109), forming a silicon nitride (SiN) polish stop layer 111 on the pad oxide 101, forming a photoresist or hard mask 113 over the active areas 115, etching a trench 117 in the silicon layer 109 between active areas 115, stripping the resist or hard mask 113, cleaning, forming an oxide liner (not shown) in the trench 117, filling the trench 117 with a field oxide (FOX) such as silicon oxide, forming STI regions 119, and performing chemical mechanical polishing (CMP) stopping on the pad nitride 111.

Once the STI regions are formed, pre-gate implants in the active areas 115 may damage the FOX, thereby causing an increased wet etch rate of the FOX. Also, oxide mask removal during channel silicon germanium (c-SiGe) formation may cause step height differences on the FOX between the PFET and NFET. Stripping either the PAD oxide or a sacrificial oxide formed on a pre-damaged FOX may then cause further damage to the FOX. Divots may then be formed in the surface of the STI regions. The uneven FEOL topology results in an uncontrolled gate taper profile, which in turn results in an exposed high-k/TiN layer, as the encapsulation layer will be opened at the tapered sidewall. Subsequent wet etches can remove parts of the TiN from the gate stack which results in threshold voltage (Vt) shifts, reducing yield.

Efforts have been made to flatten the FEOL topology by adjusting deglaze. Deglaze moves the STI oxide surface above, flush with, or below the active silicon at polysilicon deposition. Further efforts to flatten the FEOL topology include adjusting NFET and PFET mask removal to recover the N-to-P STI topology delta that is created during cSiGe integration. However, neither process can prevent the FOX damage by implants, and, therefore, the increased wet etch rate. Further, divot formation due to oxide loss post STI SiN strip, caused by isotropic wet etch steps such as sacrificial oxide clean and wet pre dual gate oxide clean and dual gate oxide etching, cannot be suppressed. Although increased cure anneals (such as 1150° C.) may reduce divot formation, they require a high thermal budget which causes wafer warpage and a negative impact on the resulting devices.

A need therefore exists for methodology enabling a divot free, zero step height STI topology, and the resulting semiconductor device.

SUMMARY

An aspect of the present disclosure is a method of fabricating a high-K/metal gate semiconductor device by forming a nitride cap on the STI region during FEOL processing.

Another aspect of the present disclosure is a device with an STI region having a zero step height and no divots in the semiconductor substrate adjacent to the STI region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a pad oxide layer on a substrate; forming a shallow trench isolation (STI) region in the substrate with the top surface level with the top surface of the pad oxide; forming a nitride cap on the STI region and on a portion of the pad oxide layer on each side of the STI region; implanting a dopant into the substrate; deglazing the pad oxide layer; removing the nitride cap; and removing the pad oxide layer.

Aspects of the present disclosure include forming a silicon germanium channel (c-SiGe) in the substrate prior to deglazing the pad oxide layer. Further aspects include forming a high-k dielectric layer on the substrate and the STI region subsequent to removing the pad oxide layer; and forming a metal layer on the high-k dielectric. Another aspect includes forming a high-k metal gate electrode. Other aspects include forming the nitride cap of silicon nitride (SiN). Additional aspects include forming the nitride cap to a thickness of 10 nanometers (nm) to 30 nm. Further aspects include forming the nitride cap with 10 nm to 15 nm overlapping the active areas on each side of the STI region. Other aspects include forming the nitride cap by: depositing a SiN layer on the pad oxide and STI region; forming an inverse active area mask on the SiN layer; and etching the SiN. Additional aspects include forming the pad oxide layer to a thickness of 5 nm to 15 nm. Another aspect includes deglazing the cap nitride layer and therewith the pad oxide layer by 1 nm to 5 nm. Further aspects include forming the STI region in the silicon layer of a silicon on insulator (SOI) or bulk silicon substrate.

Another aspect of the present disclosure is a device including a substrate; a shallow trench isolation (STI) region in the substrate; pre-gate implants in the substrate; a high-k dielectric layer on the substrate and the STI region; and a metal layer on the high-k dielectric layer; wherein the STI region has a step height of zero and the substrate adjacent the STI region is substantially free of divots.

Aspects include the device being formed by: forming a pad oxide layer on the substrate; forming the STI region in the substrate, the STI region having a top surface level with the top surface of the pad oxide layer; forming a nitride cap on the STI region and on a portion of the pad oxide layer on each side of the STI region; implanting a dopant into the substrate; deglazing the nitride cap and therewith the pad oxide layer; removing the nitride cap; removing the pad oxide layer; forming the high-k dielectric layer on the substrate and the STI region; and forming the metal layer on the high-k dielectric layer. Further aspects include a silicon germanium channel (c-SiGe) in the substrate, the c-SiGe being formed prior to deglazing the pad oxide layer. Another aspect includes the nitride cap being formed with 10 nm to 15 nm overlapping the active areas on each side of the STI region. Additional aspects include the substrate being an SOI or bulk silicon substrate.

Another aspect of the present disclosure is a method including depositing a pad oxide layer on a semiconductor-on-insulator (SOI) substrate; forming a shallow trench isolation (STI) region in the semiconductor layer of the substrate, by forming a trench and filling the trench with an oxide to a height level with the top surface of the pad oxide layer; depositing a silicon nitride (SiN) layer to a thickness of 10 nm to 30 nm on the STI region; forming an inverse active area mask on the SiN layer; etching the SiN, leaving an SiN cap on the STI region and on 10 nm to 15 nm of the pad oxide layer on each side of the STI region; implanting a dopant into source/drain regions of semiconductor substrate; forming a silicon germanium channel (c-SiGe) in the semiconductor substrate; deglazing the nitride cap and therewith the pad oxide layer; stripping the nitride cap; and stripping the pad oxide layer.

Aspects include forming a high-k dielectric layer, a metal layer containing e.g. titanium nitride (TiN), and a poly-silicon layer on the semiconductor substrate and STI region, subsequent to stripping the pad oxide layer. Further aspects include forming a high-k metal gate on the semiconductor substrate. Other aspects include stripping the nitride cap with a hot phosphorus etchant.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of divot formation and STI step height attendant upon FEOL processing in forming a high-k metal gate device. In accordance with embodiments of the present disclosure, a SiN cap is formed over the STI region and partially over adjacent regions prior to pre-gate implantation and c-SiGe formation. The SiN cap is removed before formation of the gate oxide. In this embodiment, the STI field oxide is not damaged by FEOL processes, divots are not formed at the edge between the STI region and the source/drain region, and no step height is produced on the STI region, resulting in improved high-k/TiN encapsulation of the gate stack.

Methodology in accordance with embodiments of the present disclosure includes forming a pad oxide layer on a substrate, forming a shallow trench isolation (STI) region in the substrate with the top surface level with the top surface of the pad oxide, forming a nitride cap on the STI region and on a portion of the pad oxide layer on each side of the STI region, implanting a dopant into the substrate, deglazing the nitride cap and therewith the pad oxide layer, removing the nitride cap, and removing the pad oxide layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
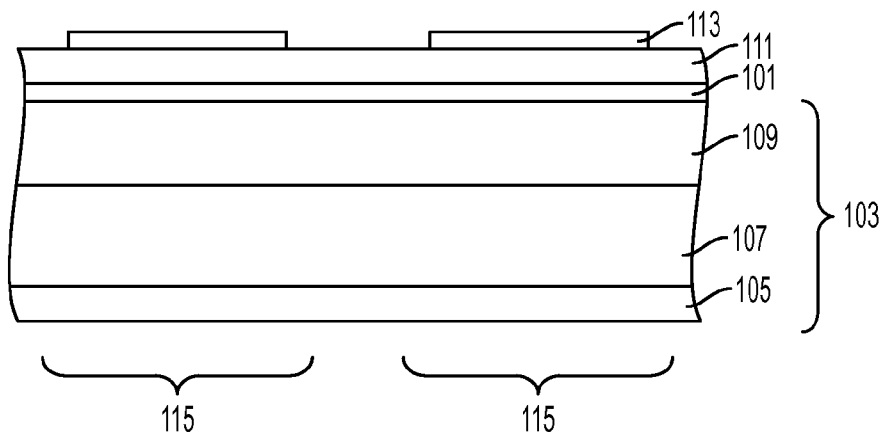
FIGS. 1A through 1C schematically illustrate conventional formation of STI regions.
Figure 1B:
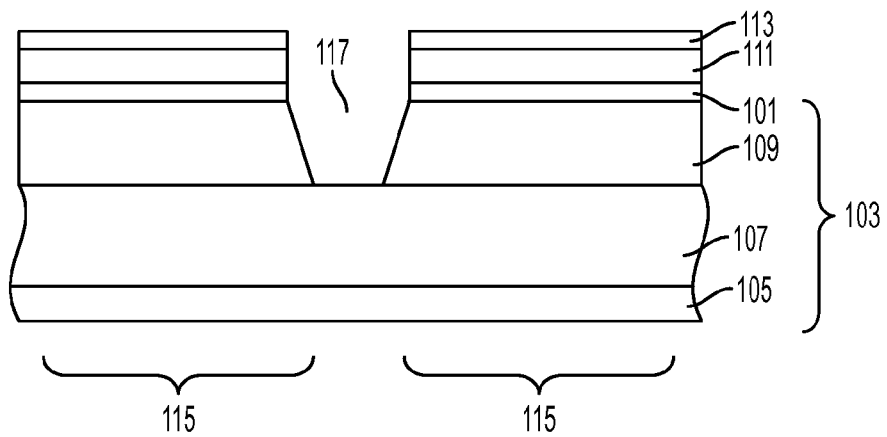
Figure 1C:
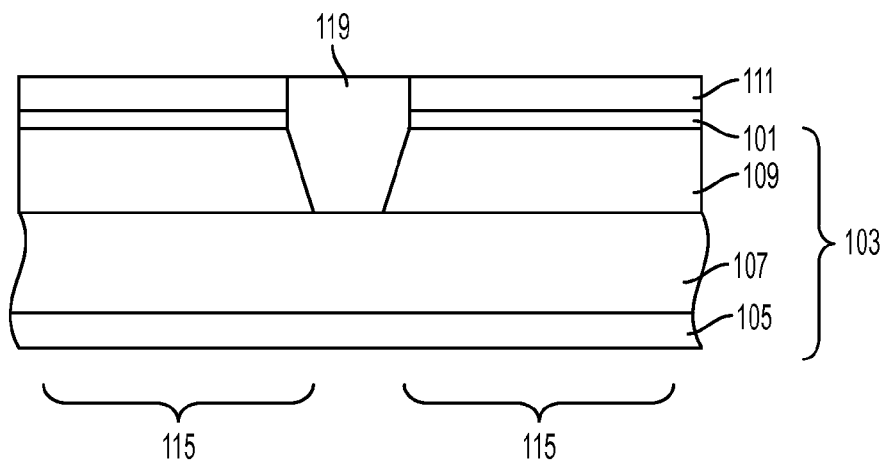
Figure 2A:
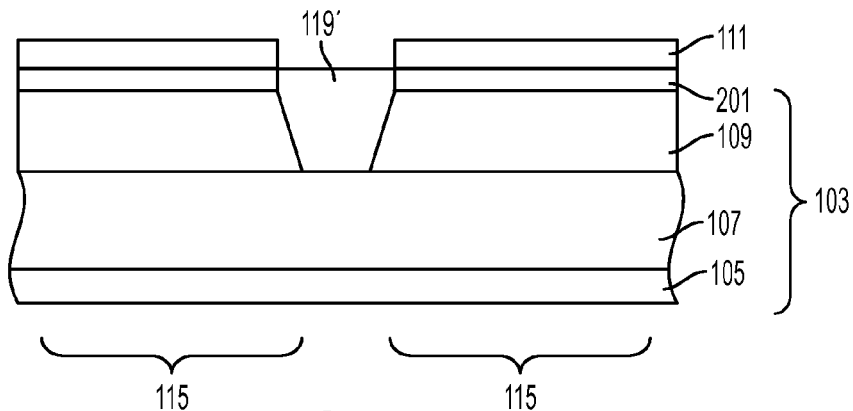
FIGS. 2A through 2G schematically illustrate sequential steps of a method in accordance with an exemplary embodiment.

Adverting to FIG. 2A, in accordance with an exemplary embodiment, STI regions 119 are formed as illustrated in FIGS. 1A through 1C, except with a thicker pad oxide layer 201, for example having a thickness of 5 nm to 15 nm. Then, the STI regions are deglazed down to pad oxide layer 201, leaving STI region 119'. The deglazing may be a wet or dry etch.

Figure 2B:
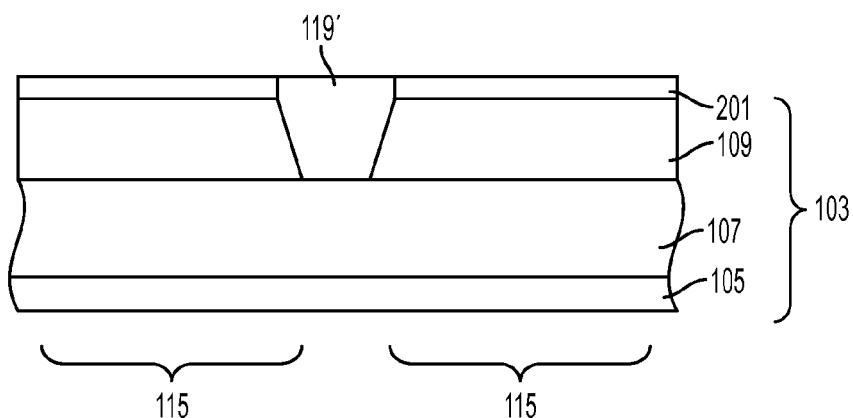

As illustrated in FIG. 2B, pad nitride 111 is stripped, for example by a hot phosphorus nitride strip. Since the STI regions 119' are deglazed down to the pad oxide layer 201, no step height is formed when pad nitride 111 is removed.

Figure 2C:
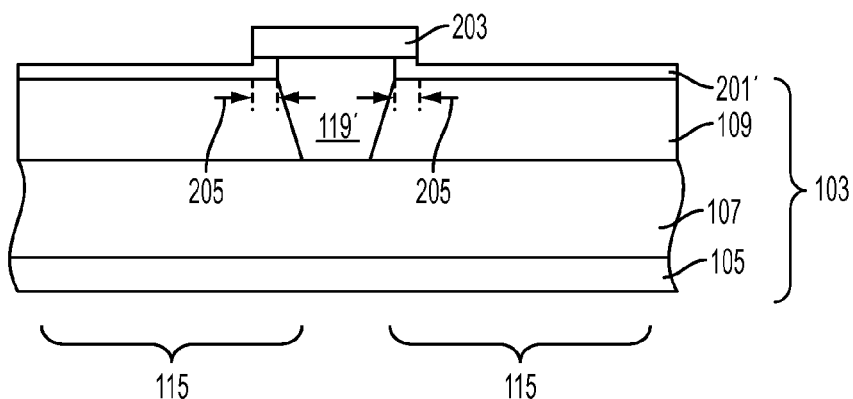

A nitride cap 203, for example of SiN, is formed on STI regions 119' and partially overlapping active regions 115, as illustrated in FIG. 2C. Nitride cap 203 is formed by depositing a nitride layer to a thickness of 10 nm to 30 nm, e.g. 20 nm, forming an inverse active area mask on the nitride layer, and etching the nitride. The resulting nitride cap 203 overlaps active regions 115 by 10 nm to 15 nm (shown at 205). Nitride cap 203 must be thick enough to prevent implants from reaching STI 119'. Further, the overlap 205 may be selected to prevent FEOL cleans from reaching STI 119', thereby eliminating divots from forming. During etching/patterning of the nitride cap, some of pad oxide layer 201, for example 3 nm to 10 nm, may be consumed creating a recess, leaving pad oxide layer 201'.

Figure 2D:
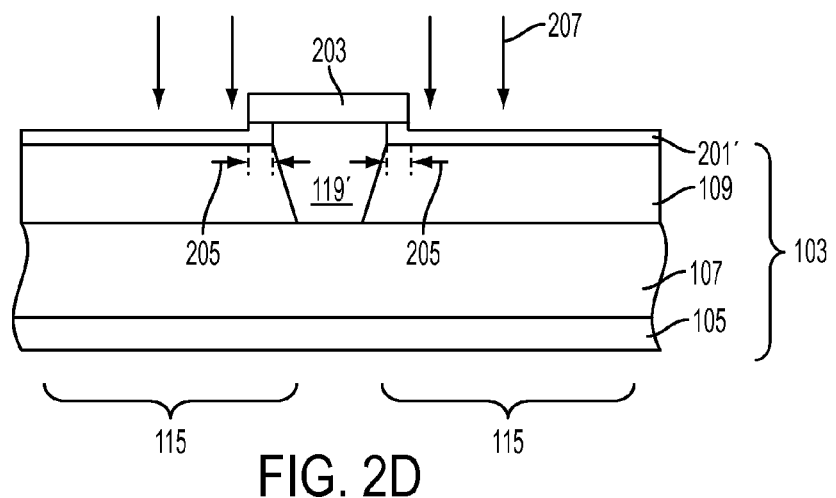

Adverting to FIG. 2D, pre-gate implants 207 are performed. Nitride cap 203 protects STI regions 119' from the implants. A c-SiGe channel (not shown for illustrative convenience) may then be grown on the active region 115 for p-type transistors.

Figure 2E:
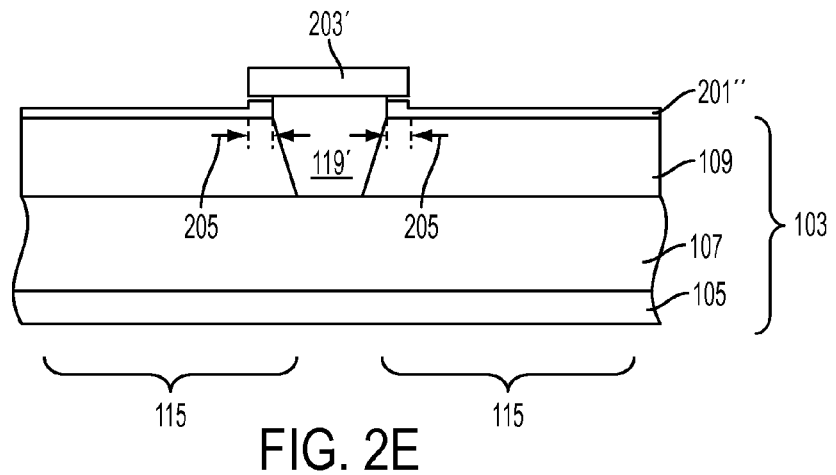

Deglaze may then be performed on nitride cap 203, and consequently on pad oxide 201', to remove any native oxide on nitride cap 203 (see FIG. 2E). Deglazing may remove 1 nm to 5 nm of nitride cap 203 and pad oxide 201', leaving nitride cap 203' and pad oxide 201".

Figure 2F:
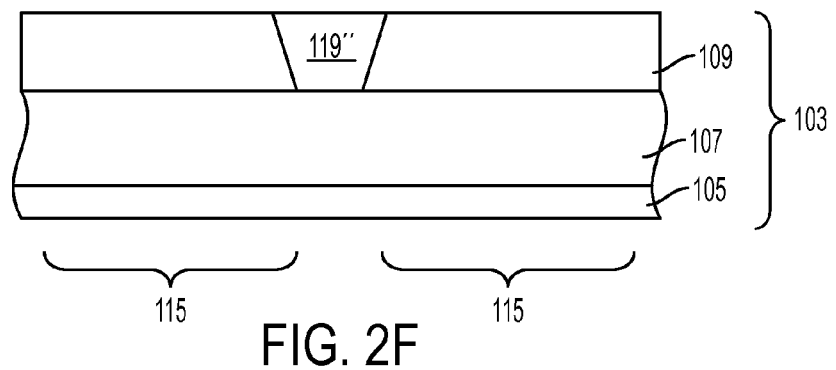

As illustrated in FIG. 2F, nitride cap 203' may be removed, for example by hot phosphorus, as all steps that may damage the field oxide of STI region 119' have already occurred. Pad oxide 201" may then be stripped, e.g. with hydrofluoric acid (HF). The top portion of STI region 119' is removed with pad oxide 201", leaving STI region 119". As illustrated, the resulting structure has no step height between the STI region 119"

and silicon layer 109. Alternatively, if any step height remains, it is tunable. If a step is desired, it can be processed easily and can be well controlled.

Figure 2G:
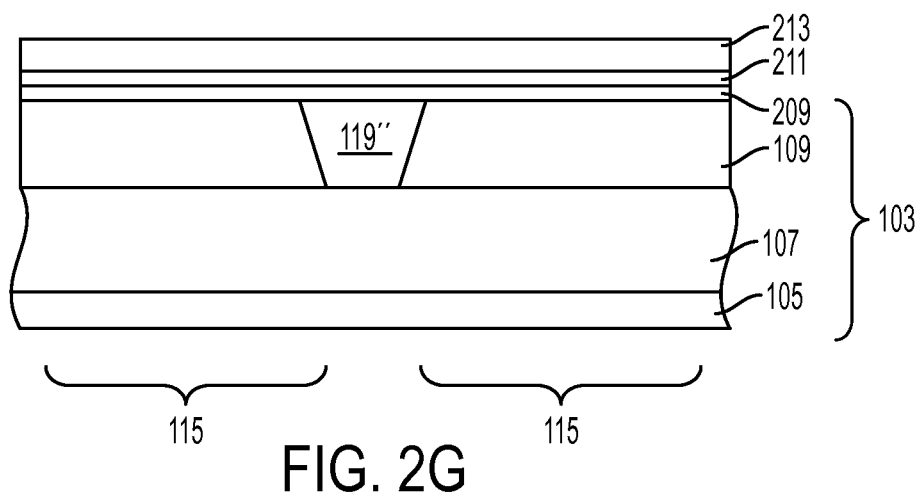

Adverting to FIG. 2G, a high-k dielectric layer 209, metal layer 211, and polysilicon layer 213 may be deposited on silicon layer 109 and STI region 119". A high-k metal gate (not shown for illustrative convenience) may then be formed by conventional techniques. High-k dielectric layer 209 may be formed, for example, of a hafnium based oxide, a hafnium based oxynitride, or a hafnium-silicon oxynitride, and metal layer 211 may, for example, be formed of TiN.

The embodiments of the present disclosure can achieve several technical effects, including reduced divot formation at the edge between the STI region and the source/drain region and flat STI topology, resulting in improved high-k/TiN encapsulation of the gate stack. The present disclosure enjoys industrial applicability in any of various types of highly integrated gate first high-k semiconductor technologies, particularly in 32 nm technology node devices and beyond, and also in any of various types of gate last, or replacement gate, semiconductor technologies.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a pad oxide layer on a substrate;
   forming a shallow trench isolation (STI) region in the substrate with the top surface level with the top surface of the pad oxide;
   forming a nitride cap on the STI region and on a portion of the pad oxide layer on each side of the STI region, the portion being less than the entire pad oxide layer;
   implanting a dopant into the substrate;
   deglazing the nitride cap and pad oxide layer;
   removing the nitride cap; and
   removing the pad oxide layer.

2. The method according to claim 1, further comprising forming a silicon germanium channel (c-SiGe) in the substrate prior to deglazing the nitride cap and pad oxide layer.

3. The method according to claim 2, further comprising:
   forming a high-k dielectric layer on the substrate and the STI region subsequent to removing the pad oxide layer; and
   forming a metal layer on the high-k dielectric.

4. The method according to claim 3, further comprising forming a high-k metal gate electrode.

5. The method according to claim 1, comprising forming the nitride cap of silicon nitride (SiN).

6. The method according to claim 5, comprising forming the nitride cap to a thickness of 10 nanometers (nm) to 30 nm.

7. The method according to claim 6, comprising forming the nitride cap with 10 nm to 15 nm overlapping the active areas on each side of the STI region.

8. The method according to claim 7, comprising forming the nitride cap by:
   depositing a SiN layer on the pad oxide and STI region;
   forming an inverse active area mask on the SiN layer; and
   etching the SiN.

9. The method according to claim 1, comprising forming the pad oxide layer to a thickness of 5 nm to 15 nm.

10. The method according to claim 1, comprising deglazing the nitride cap and pad oxide layer by 1 nm to 5 nm.

11. The method according to claim 1, comprising forming the STI region in the silicon layer of a silicon on insulator (SOI) substrate.

12. A method comprising:
    depositing a pad oxide layer on a semiconductor-on-insulator (SOI) substrate;
    forming a shallow trench isolation (STI) region in the semiconductor layer of the substrate, by forming a trench and filling the trench with an oxide to a height level with the top surface of the pad oxide layer;
    depositing a silicon nitride (SiN) layer to a thickness of 10 nm to 30 nm on the STI region;
    forming an inverse active area mask on the SiN layer;
    etching the SiN, leaving an SiN cap on the STI region and on 10 nm to 15 nm of the pad oxide layer on each side of the STI region;
    implanting a dopant into source/drain regions of semiconductor substrate;
    forming a silicon germanium channel (c-SiGe) in the semiconductor substrate;
    deglazing the nitride cap and pad oxide layer;
    stripping the nitride cap; and
    stripping the pad oxide layer.

13. The method according to claim 12, further comprising forming a high-k dielectric layer, a metal layer comprising titanium nitride (TiN), and a poly-silicon layer on the semiconductor substrate and STI region, subsequent to stripping the pad oxide layer.

14. The method according to claim 13, further comprising forming a high-k metal gate on the semiconductor substrate.

15. The method according to claim 12, comprising stripping the nitride cap with a hot phosphorus etchant.

* * * * *